United States Patent
Kronholz et al.

(10) Patent No.: US 8,338,274 B2
(45) Date of Patent: Dec. 25, 2012

(54) TRANSISTOR DEVICE COMPRISING AN EMBEDDED SEMICONDUCTOR ALLOY HAVING AN ASYMMETRIC CONFIGURATION

(75) Inventors: Stephan Kronholz, Dresden (DE); Vassilios Papageorgiou, Austin, TX (US); Gunda Beernink, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 158 days.

(21) Appl. No.: 12/648,867

(22) Filed: Dec. 29, 2009

(65) Prior Publication Data

US 2010/0163939 A1  Jul. 1, 2010

(30) Foreign Application Priority Data

Dec. 31, 2008  (DE) .................. 10 2008 063 399

(51) Int. Cl.
*H01L 29/78* (2006.01)
*H01L 21/20* (2006.01)

(52) U.S. Cl. ............... 438/478; 257/288; 257/E29.255; 257/E21.131

(58) Field of Classification Search .......... 257/288, 257/E29.255, E21.131; 438/478
See application file for complete search history.

(56) References Cited

U.S. PATENT DOCUMENTS

| | | | | |
|---|---|---|---|---|
| 7,354,839 | B2 * | 4/2008 | Wei et al. | 438/305 |
| 7,964,465 | B2 * | 6/2011 | Anderson et al. | 438/283 |
| 2007/0290192 | A1 | 12/2007 | Rotondaro | 257/19 |
| 2008/0171426 | A1 | 7/2008 | Ren et al. | 438/530 |
| 2008/0296692 | A1 * | 12/2008 | Griebenow et al. | 257/368 |

OTHER PUBLICATIONS

Translation of Official Communication from German Patent Office for German Patent Application No. 10 2008 063 399.2 dated Jun. 11, 2010.

* cited by examiner

*Primary Examiner* — Calvin Lee
*Assistant Examiner* — Monica D Harrison
(74) *Attorney, Agent, or Firm* — Williams, Morgan & Amerson, P.C.

(57) ABSTRACT

In sophisticated semiconductor devices, an asymmetric transistor configuration may be obtained on the basis of a strain-inducing semiconductor alloy. To this end, strain relaxation implantation processes may be performed at the drain side according to some illustrative embodiments, while, in other cases, the deposition of the strain-inducing alloy may be performed in an asymmetric manner with respect to the drain side and the source side of the transistor.

25 Claims, 7 Drawing Sheets

TRANSISTOR DEVICE COMPRISING AN EMBEDDED SEMICONDUCTOR ALLOY HAVING AN ASYMMETRIC CONFIGURATION

BACKGROUND OF THE INVENTION

1. Field of the Invention

Generally, the present disclosure relates to integrated circuits, and, more particularly, to transistors having complex dopant profiles and including an embedded semiconductor alloy, such as a silicon/germanium alloy, for creating strain in the channel region.

2. Description of the Related Art

Integrated circuits comprise a large number of circuit elements on a given chip area according to a specified circuit layout, wherein transistors, such as field effect transistors, represent an important component that is used as switching element, current and/or voltage amplifier. The transistors are formed in and above substantially crystalline semiconductor regions with additional dopant materials that are formed at specified substrate locations to act as "active" regions, that is, to act, at least temporarily, as conductive areas for creating a controlled current flow. Generally, a plurality of process technologies are currently practiced, wherein, for complex circuitry, such as microprocessors, storage chips and the like, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A transistor, irrespective of whether an N-channel transistor or a P-channel transistor or any other transistor architecture is considered, comprises so-called PN junctions that are formed by an interface of highly doped regions, such as drain and source regions, with a lightly doped or non-doped region, such as a channel region, disposed adjacent to the highly doped regions. In the case of a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of the MOS transistors. Thus, the scaling of the channel length, and associated therewith the reduction of channel resistivity, renders the channel length a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the dimensions of transistors. For example, highly sophisticated dopant profiles, in the vertical direction as well as in the lateral direction, are required in the drain and source regions to provide low sheet and contact resistivity in combination with a desired channel controllability in order to counter so-called short channel effects, such as drain-induced barrier lowering and the like. In addition, the vertical location of the PN junctions with respect to the gate insulation layer also represents a critical design criterion in view of leakage current control, as reducing the channel length also requires reducing the depth of the drain and source regions with respect to the interface formed by the gate insulation layer and the channel region, thereby calling for sophisticated implantation techniques.

Furthermore, since the continuous size reduction of the critical dimensions, e.g., the gate length of the transistors, necessitates the adaptation and possibly the new development of highly complex process techniques concerning the above-identified process steps, it has been proposed to also enhance device performance of the transistor elements by increasing the charge carrier mobility, for instance, in the channel region for a given channel length, thereby offering the potential for achieving a performance improvement that is comparable with the advance to a future technology node of down-sized devices while avoiding many of the above process adaptations associated with device scaling. In principle, at least two mechanisms may be used, in combination or separately, to increase the mobility of the charge carriers in the channel region. First, in field effect transistors, the dopant concentration within the channel region may be reduced, thereby reducing scattering events for the charge carriers and thus increasing the conductivity. However, reducing the dopant concentration in the channel region significantly affects the threshold voltage of the transistor device, thereby presently making a reduction of the dopant concentration a less attractive approach unless other mechanisms are developed to adjust a desired threshold voltage. Second, the lattice structure in respective semiconductor regions, such as the channel region, may be dilated/stretched, for instance by creating tensile or compressive strain therein, which results in a modified mobility for electrons and holes, respectively. For example, creating uniaxial tensile strain in the channel region of a field effect transistor with respect to the current flow direction increases the mobility of electrons, which in turn may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor, which may enable the fabrication of fast powerful semiconductor devices without requiring expensive semiconductor materials and manufacturing techniques.

Consequently, it has been proposed to introduce a silicon/germanium alloy in the drain and source regions of P-channel transistors to create compressive stress that may result in a corresponding strain.

With reference to FIGS. 1a-1c, typical conventional approaches will be described for enhancing performance of P-channel transistors with respect to reduce short channel effects, enhancing charge carrier mobility in the channel region and reducing overall series resistance of the drain/source path.

FIG. 1a schematically illustrates a cross-sectional view of a P-channel transistor 100 including a substrate 101, such as a silicon bulk substrate, or a silicon-on-insulator (SOI) substrate, i.e., a buried insulating layer (not shown) may be formed on the substrate 101. Furthermore, a semiconductor layer 102, such as a silicon layer, is formed above the substrate 101 and may include isolation structures 103, such as shallow trench isolations and the like. The isolation structures 103 may define an "active" region in and above which one or more transistor elements may be formed, such as the transistor 100. It should be appreciated that an active region is to be understood as a semiconductor region receiving or having formed therein appropriate dopant profiles to adjust the overall conductivity in accordance with device requirements, for instance for achieving transistor characteristics and the like. In the manufacturing stage shown, a gate electrode structure may be formed above the semiconductor layer 102, wherein a gate insulation layer 104A of the gate electrode structure separates a gate electrode material 104, such as polysilicon and the like, from a channel region 105 in the semiconductor layer 102. Moreover, as illustrated, the gate electrode material 104 may have formed on sidewalls thereof a non-electrode material in the form of spacer elements 104B, such as silicon dioxide and the like. Furthermore, the gate electrode structure 104 is encapsulated by spacer elements 107 and a cap layer 108, which may, for instance, be comprised of silicon nitride. Furthermore, recesses or cavities 106 are formed in the semiconductor layer 102 laterally adjacent to and offset from the gate electrode structure 104, wherein a lateral offset is substantially determined by the width of the spacer 104B and the spacer 107.

A typical conventional process flow for forming the transistor 100 as shown in FIG. 1a may comprise the following processes. After forming the isolation structures 103, an appropriate vertical dopant profile within the semiconductor layer 102 may be defined by accordingly designed implantation processes. Thereafter, material layers for the gate electrode structure 104, i.e., a gate dielectric material and an electrode material, may be formed by appropriate techniques, such as thermal or wet chemical oxidation and/or deposition for the gate dielectric, while, frequently, low pressure chemical vapor deposition (LPCVD) may be used for depositing polysilicon as a gate electrode material. Moreover, further material layers, such as material for the cap layer 108, which may act as a portion of an anti-reflective coating (ARC), may also be deposited in accordance with well-established process recipes. The resulting layer stack may then be patterned by advanced photolithography and etch techniques, followed by the formation of the spacer 104B, for instance by thermal oxidation, deposition and the like. Next, a spacer material may be deposited, for instance in combination with a liner material, if required, which may then be patterned by well-established anisotropic etch techniques to obtain the spacer elements 107, the width of which may substantially determine the lateral offset of the cavities 106.

As previously explained, uniaxial compressive strain in the channel region 105 in the current flow direction may significantly enhance the mobility of holes, thereby enhancing overall performance of the transistor 100 when representing a P-channel transistor. In order to provide the desired compressive strain, the cavities 106 may be formed by well-established etch techniques using the spacers 107 and the cap layer 108 as an etch mask, wherein, in the example shown, the isolation structures 103 may act as an etch mask. In other cases, an additional hard mask layer may be provided if the lateral extension of the cavities 106 is to be restricted so as to not entirely extend to the isolation structures 103. During the corresponding etch process, a certain amount of template material of the layer 102 may also be maintained if an SOI configuration is considered, in which a buried insulating layer may be positioned between the substrate 101 and the semiconductor layer 102. The cavities 106 may be refilled with an appropriate semiconductor material, such as a silicon/germanium alloy, which has a natural lattice constant that is greater than the lattice constant of silicon, so that the corresponding epitaxially grown material may be formed in a strained state, thereby also exerting stress to the channel region 105 and thus creating a respective compressive strain therein. Selective epitaxial growth techniques for depositing silicon/germanium alloy materials are well established in the art and may be performed on the basis of appropriately selected process parameters, such as temperature, pressure, flow rate of precursor gases and carrier gases, in such a manner that a significant deposition of material is substantially restricted to the crystalline silicon surfaces, while a deposition on dielectric materials may be suppressed. Moreover, during the deposition of the silicon/germanium material, a desired dopant species may also be incorporated into the deposition atmosphere, such as boron, in order to obtain a desired base doping for drain and source regions, depending on the required complexity of the vertical and lateral profile of the drain and source regions. Generally, a reduced series resistance of the drain and source regions may be achieved by providing high dopant concentrations, while, on the other hand, for highly scaled semiconductor devices, the corresponding electric field generated across the channel region 105 may result in increased charge carrier injection into the gate insulation layer 104A at high dopant concentrations, thereby typically requiring a reduced dopant concentration and a shallow profile of the drain and source regions in the vicinity of the gate electrode structure 104.

FIG. 1b schematically illustrates the transistor 100 in a further advanced manufacturing stage in which a silicon/germanium alloy 109 may be formed in the cavities 106, as explained above, and wherein the spacers 107 and the cap layer 108 may be removed to expose the gate electrode structure 104. It should be appreciated that the spacers 104B may also be removed and may be replaced by appropriately designed offset spacers, if desired. As explained above, upon reducing the transistor dimensions, i.e., the gate length of the transistor 100, which is to be understood as the horizontal dimension of the gate electrode structure 104 in FIG. 1b, controllability of the channel region 105 may become increasingly difficult due to the short channel effects which, in some conventional approaches, may be countered in part by providing counter-doped regions 110, which may also be referred to as halo regions, in which the dopant concentration of the channel region 105 and the remaining semiconductor region, also referred to as the body region 102A, is significantly increased, thereby adjusting the dopant gradient at corresponding PN junctions by providing shallow doped drain and source regions. Typically, the counter-doped regions or halo regions 110 may be formed by ion implantation, for instance using a tilt angle, in order to establish a certain degree of overlap with the gate electrode structure 104. However, upon further scaling the transistor dimensions, the dopant concentration and thus implantation dose may have to be increased, thereby also increasing dopant induced charge carrier scattering, dopant diffusion and, due to the high dose implantation processes involved, stress relaxation in the vicinity of the channel region 105. Furthermore, a dopant concentration in the drain and source regions is generally increased in order to obtain a reduced series resistance of the drain and source regions. On the other hand, dose and energy for the implantation process for creating the halo regions 110 has to be increased if performance limitations are to be avoided. This in turn may further increase stress relaxation in the silicon/germanium alloy due to increased lattice damage and higher dopant diffusion. During the sophisticated implantation processes, longer treatment times may be required to obtain the desired high dose during the creation of the halo regions 110. Thus, although the silicon/germanium material 109 may be provided with high intrinsic dopant concentration, nevertheless, sophisticated and long implantation processes may be required for adjusting the PN junctions in the vicinity of the gate electrode structure 104 on the basis of the halo regions 110.

For these reasons and due to the fact that overall charge carrier mobility may also be increased by restricting dopant species only at locations where required, it has also been proposed to provide asymmetric halo regions, which may be accomplished by using a non-zero tilt angle during the corresponding halo implantations in an asymmetric manner or by substantially completely avoiding the incorporation of a counter dopant species in one of the drain and source regions, for instance in the drain region, to further enhance overall transistor performance while avoiding some of the above-identified problems. However, using asymmetric transistor configurations on the basis of asymmetric halo implantation regions may require even further sophisticated implantation techniques, which may frequently not be compatible with other device and process requirements. Furthermore, further layout constraints may have to be respected, for instance, by appropriately orienting the transistor devices to allow the corresponding sophisticated tilted implantation processes for obtaining the desired complex asymmetric profiles. Consequently, high efforts in terms of redesigning integrated circuits and providing corresponding process capabilities with respect to sophisticated implantation processes may be required in order to further enhance overall transistor performance. Other techniques used with respect to further enhancing transistor performance, such as generally increasing the channel doping concentration, may result in degradation of carrier mobility due to increased charge carrier scattering, thereby rendering these concepts less desirable in view of further device performance enhancement.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure relates to method and semiconductor devices in which complex vertical and lateral drain and source configurations may be obtained to define an asymmetric transistor configuration, in which the asymmetric configuration is based on an asymmetry of a source side relative to a drain side of the transistor by providing a strain-inducing semiconductor alloy, such as a silicon/germanium material, in an asymmetric manner. The asymmetric nature of the strain-inducing material may be obtained on the basis of sophisticated epitaxial growth techniques and appropriate masking regimes in order to avoid or at least reduce the requirement for sophisticated tilted implantation techniques, which may require additional resources in view of implantation tools, thereby contributing to overall manufacturing costs while also reducing the total cycle time of the semiconductor products. Furthermore, by reducing or avoiding extended implantation processes, the number of lithography masks, i.e., reticles, may be reduced, and device variability, which may generally be introduced by performing implantation processes due to the inherent variability of the implantation process, may also be reduced. Additionally, enhanced design flexibility may be achieved, since sophisticated design strategies for appropriately arranging transistor elements in view of enabling tilted implantation processes, may be avoided or at least the corresponding constraints may be less demanding. Consequently, by generating an asymmetric transistor configuration on the basis of a difference in corresponding semiconductor alloys at the source side and the drain side based on efficient masking regimes, the transistor characteristics may be adjusted with an enhanced degree of accuracy, thereby contributing to scalability of the corresponding manufacturing techniques in view of future transistor generations, while also enhancing performance and throughput of the available semiconductor designs. Furthermore, by appropriately adjusting the electric field in the drain and source areas, i.e., enhancing field strength and/or carrier mobility at the source side for enhanced charge-carrier injection, while reducing field strength and/or charge carrier mobility at the drain side, hot carrier injection, i.e., injection of high energy charge carrier into the gate insulation material may be reduced and increased impact ionization at the drain side may be lowered, thereby reducing the floating body effect in SOI devices. Furthermore, due to the superior electric field distribution obtained on the basis of an asymmetric configuration of a strain-inducing semiconductor alloy, a long term degradation of transistors caused by hot carrier injection may also be reduced, thereby contributing to enhanced reliability and higher long term performance of the transistors.

One illustrative method disclosed herein comprises forming a semiconductor alloy in cavities formed in a crystalline semiconductor region, wherein the cavities are laterally offset from a channel region of a transistor and wherein the semiconductor alloy induces strain in the channel region. Furthermore, the method comprises selectively introducing a non-doping species into the semiconductor alloy that is positioned at a drain side of the transistor to reduce an internal strain level of the semiconductor alloy positioned at the drain side.

A further illustrative method disclosed herein relates to forming an asymmetric transistor. The method comprises forming a source side cavity in a semiconductor region, wherein the source side cavity is positioned laterally offset from a channel region that is located below a gate electrode structure of the transistor. Moreover, the method comprises forming a strain-inducing semiconductor alloy in the source side cavity, wherein the strain-inducing semiconductor alloy represents an asymmetric transistor configuration of a source side relative to a drain side of the transistor.

One illustrative asymmetric transistor disclosed herein comprises a gate electrode structure formed above a channel region. Furthermore, a source region is formed at a source side of a semiconductor region of the transistor. Additionally, a strain-inducing semiconductor alloy is formed at the source side. Furthermore, the asymmetric transistor comprises a drain region formed at a drain side of the semiconductor region, wherein the drain side differs from the source side in an amount of strain induced in the channel region and differs further in at least one of the material compositions, a dopant profile and a dopant concentration.

BRIEF DESCRIPTION OF THE DRAWINGS

The disclosure may be understood by reference to the following description taken in conjunction with the accompanying drawings, in which like reference numerals identify like elements, and in which.

Figure 1A:
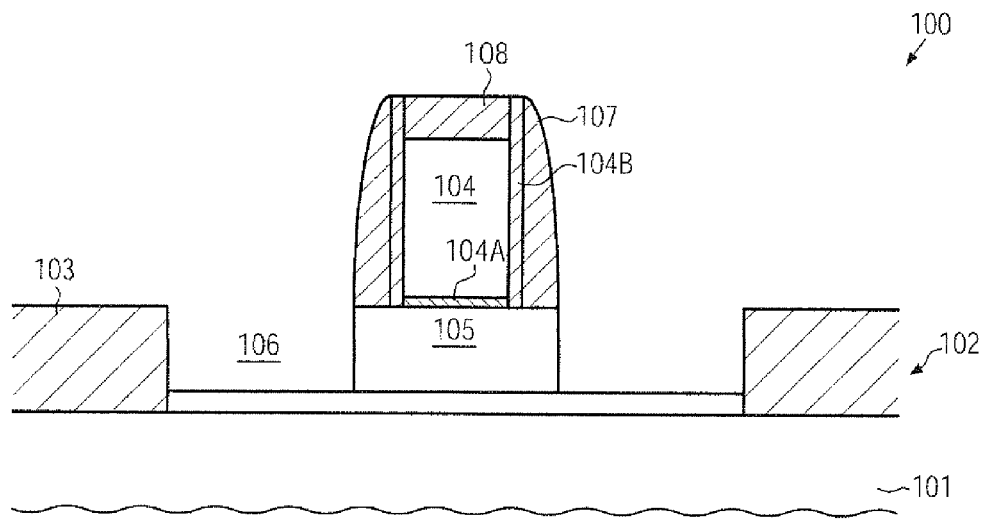
FIGS. 1a-1b schematically illustrate cross-sectional views of a conventional P-channel transistor during various manufacturing stages in providing an embedded silicon/germanium alloy in combination with a sophisticated dopant profile obtained on the basis of complex implantation processes.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and methods in which an asymmetric transistor configuration may be obtained on the basis of asymmetrically providing a strain-inducing semiconductor alloy in order to provide enhanced charge carrier mobility and/or increased electric field strength at a source side, while reducing one or both of these components at the drain side of the transistor. The asymmetric configuration of the strain-inducing semiconductor alloy may be accomplished on the basis of a process strategy that may allow a high degree of compatibility with conventional strategies, while nevertheless providing an additional degree of freedom in adjusting the overall transistor characteristics. For example, in some illustrative embodiments, a strain-inducing semiconductor alloy, such as a silicon/germanium alloy, a silicon/tin alloy, a silicon/germanium/tin alloy, a silicon/carbon alloy, may be formed on the basis of well-established manufacturing techniques, wherein, however, corresponding characteristics of the strain-inducing semiconductor alloy, such as in situ doping, material composition in order to adjust the degree of strain and the like, may be selected so as to comply with the requirements at the source side, while an asymmetric configuration may be obtained on the basis of a less critical implantation process, for instance performed on the basis of a non-doping species, such as xenon, argon, fluorine and the like, in order to create a significant strain-relaxing effect. The implantation process may be performed on the basis of an implantation mask, wherein, on the other hand, process parameters of the implantation process may be less critical, for instance compared to sophisticated tilted implantation sequences, while an appropriate implantation species may be used in order to maintain overall cycle time at a low level. That is, by using a heavy species, such as xenon ions, a significant degree of strain relaxation may be accomplished at a moderately low implantation dose so that a significant increase in overall throughput and reduction in process complexity may be achieved compared to sophisticated implantation regimes, as previously explained. At the same time, an efficient modification of the transistor characteristics may be accomplished in an asymmetric manner, thereby achieving at least some of the advantages discussed above.

In still other illustrative embodiments, a desired asymmetric configuration may be accomplished by using an appropriate masking regime, for instance without requiring additional lithography steps, compared to conventional manufacturing techniques, wherein a cavity for accommodating the strain-inducing semiconductor alloy may be formed selectively at the source side, while the drain side may be covered by an etch mask and a corresponding deposition mask. In other illustrative embodiments, corresponding cavities may be formed at the drain side and the source side in a common patterning process, wherein, however, corresponding deposition masks may be formed so as to enable a selective epitaxial growth process individually for each of the cavities, thereby providing enhanced flexibility in "designing" the asymmetric nature of the transistor on the basis of the epitaxially-deposited semiconductor materials.

Figure 1B:
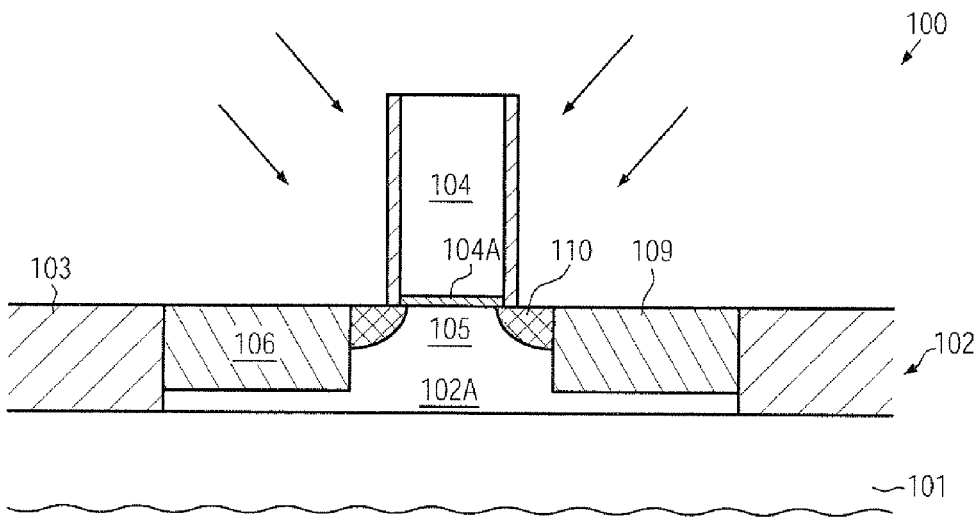

With reference to FIGS. 2a-2j, further illustrative embodiments will now be described in more detail, wherein reference may also be made to FIGS. 1a-1b if required.

Figure 2A:
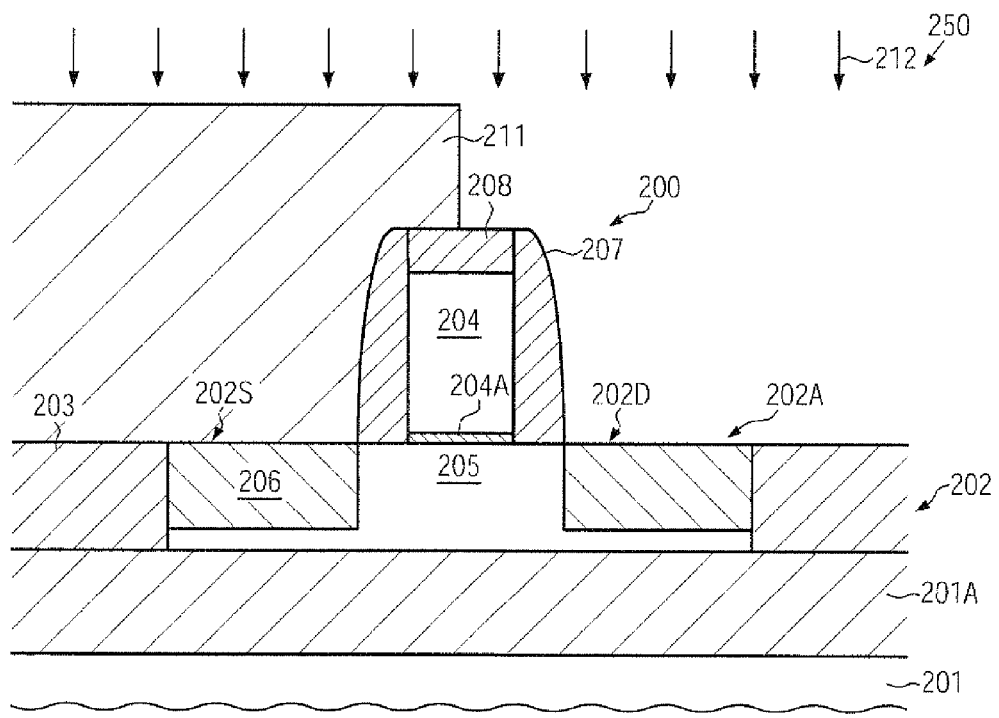
FIGS. 2a-2b schematically illustrate cross-sectional views a semiconductor device including an asymmetric transistor formed on the basis of an initially symmetrically provided semiconductor alloy, which may be relaxed in an implantation process, according to illustrative embodiments.

FIG. 2a schematically illustrates a cross-sectional view of a semiconductor device 250 comprising a substrate 201, above which may be formed a semiconductor layer 202, such as a silicon-containing semiconductor material, the electronic characteristics of which may be enhanced by providing strain-inducing components at least locally within the semiconductor layer 202. Furthermore, in the embodiment shown, a buried insulating layer 201A, such as a silicon dioxide layer and the like, may be positioned between the substrate 201 and the semiconductor layer 202. In this case, an SOI configuration may be provided, at least in some device areas of the semiconductor device 250. Furthermore, an isolation structure 203 may be formed in the semiconductor layer 202 so as to define an active region 202A, which is to be understood in the above defined sense. In the embodiment shown, the active region 202A may represent the semiconductor region in and above which a transistor 200 may be formed, the characteristics of which may be enhanced by providing an asymmetric configuration, as previously explained. In one illustrative embodiment, the transistor 200 may represent a P-channel transistor, wherein, for a standard crystallographic configuration of the active region 202A, a compressive strain component in a channel region 205 may provide enhanced performance, as discussed above. In other illustrative embodiments, the transistor 200 may represent an N-channel transistor, wherein, for a given standard crystallographic configuration of the active region 202A, a tensile strain component may result in enhanced transistor performance. In the manufacturing stage shown, the transistor 200 may comprise a gate electrode 204 that is separated from the channel region 205 by a gate insulation layer 204A. Furthermore, spacer elements 207, for instance in combination with an etch stop material (not shown), may be formed on sidewalls of the gate electrode 204, while a cap layer 208 may be formed on top of the gate electrode 204. Moreover, a strain-inducing semiconductor alloy 206, for instance in the form of one of the above-identified material mixtures, may be formed in the active region 202A at a drain side 202D and a source side 202S of the transistor 200. For example, the semiconductor alloy 206 in the manufacturing stage shown may be provided in the form of a strain-inducing material, i.e., the material 206 may be formed in a strained state, thereby also inducing a corresponding strain component in the laterally-adjacent channel region 205, as previously explained. Furthermore, the strain-inducing material 206 may, in addition to providing a corresponding strain component that may depend on the material composition, such as the germanium concentration in a silicon/germanium alloy and the like, comprise a dopant species, such as a P-type dopant species, if a P-channel transistor is considered. As discussed above, providing the material 206 in the form of an in situ doped material may enable enhanced flexibility in designing the overall characteristics of drain and source regions still to be formed. Moreover, the semiconductor device 250 may comprise an implantation mask 211, such as a resist mask, which may cover the source side 202S while exposing the drain side 202D.

The semiconductor device 250 may be formed on the basis of similar process techniques as previously described with reference to the transistor 100 explained in the context of FIGS. 1a-1b. It should be appreciated, however, that the manufacturing strategy for patterning corresponding cavities and depositing the strain-inducing semiconductor alloy 206 may be specifically designed, for instance with respect to adjusting the lateral size and depth of the corresponding cavities and thus of the alloy 206, in view of an asymmetric transistor configuration so that the material composition and/or the internal or in situ dopant concentration may, in combination with size and depth, be selected so as to obtain the desired dopant concentration and/or field strength and/or carrier mobility at the source side 202S. For this purpose, established deposition recipes may be appropriately adapted in order to obtain the desired characteristics for the material 206. After the deposition of the material 206, the resist mask 211 may formed on the basis of lithography techniques, in which a specifically designed lithography mask may be applied in order to cover the source side 202S. Thereafter, the semiconductor device 250 may be exposed to an ion bombardment 212, in which, in some illustrative embodiments, a non-doping implantation species may penetrate the exposed alloy 206 at the drain side 202D, thereby resulting in a significant strain relaxation. For example, heavy inert species, such as xenon, argon and the like, may be used on the basis of appropriately selected process parameters in order to obtain a certain degree of stress relaxation, which may be adjusted on the basis of the corresponding process parameters of the process 212. It should be appreciated that the implantation process 212 may be less critical for adjusting the overall transistor characteristics compared to sophisticated tilted implantation steps for appropriately positioning a dopant species at specific areas of a corresponding active region. That is, the implantation process 212 may be performed as a non-tilted process, wherein the diffuse incorporation of the implantation species may nevertheless provide a controllable overall effect of the implantation process, since a well-defined average relaxation effect may be accomplished, although the distribution of the concentration of the implantation species may not be exact due to the nature of implantation processes, which may be more critical for defining PN junctions and the like. Consequently, based on appropriately selected process parameters, such as dose and energy for a given implantation species, a desired degree of asymmetry may be accomplished in the material 206 between the drain side 202D and the source side 202S, which is effectively protected from a penetration of the implant species.

Figure 2B:
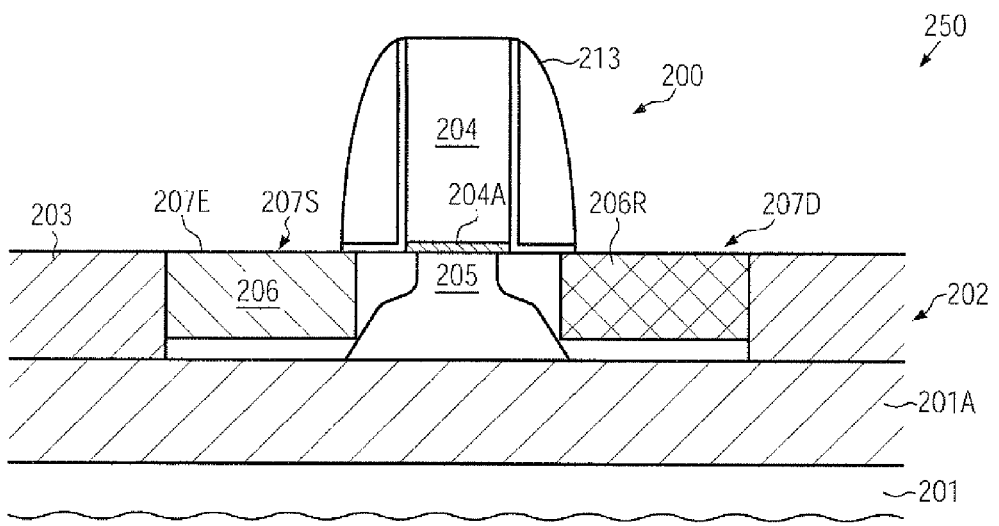

FIG. 2b schematically illustrates the semiconductor device 250 in a further advanced manufacturing stage. As illustrated, the transistor 200 may comprise drain and source regions 207D, 207S, respectively, wherein corresponding extension regions 207E may be provided, which may, in some illustrative embodiments, be formed as symmetric regions with respect to the drain and source sides 207D, 207S. Moreover, the drain region 207D may comprise at least a portion of relaxed semiconductor alloy, indicated as 206R, so as to obtain a corresponding reduced charge carrier mobility at the drain side 207D. It should be appreciate that the material 206R may still induce a certain degree of strain in the channel region 205, depending on the degree of strain relaxation during the preceding implantation process 212 (FIG. 2a), as discussed above. On the other hand, the source region 207S may comprise, at least partially, the strain-inducing semiconductor alloy 206 in order to provide superior charge carrier mobility at the source side, as previously explained. Furthermore, the transistor 200 may comprise a sidewall spacer structure 213 formed on sidewalls of the gate electrode 204, wherein the structure 213 may have any appropriate configuration so as to comply with the overall process and device requirements. For example, the structure 213 may comprise one or more individual spacer elements, possibly in combination with corresponding etch stop liners and the like.

The semiconductor device 250 as illustrated in FIG. 2b may be formed on the basis of appropriate process strategies, including the removal of the spacers 207 and the cap layer 208 (FIG. 2a) and the subsequent implantation of a dopant species to form the extension regions 207E, possibly on the basis of an appropriately dimensioned offset spacer element. Thereafter, the spacer structure 213 is formed and a further implantation process may be applied to obtain the drain and source regions 207D, 207S in accordance with overall device requirements, wherein, as previously discussed, additional implantation processes may be performed, for instance for forming a counter-doped region or halo region, as previously discussed. However, due to the asymmetric configuration obtained on the basis of the materials 206, 206R, an additional degree of freedom in adjusting the overall transistor characteristics may be attained, thereby, for instance, reducing the number of complex implantation processes, such as tilted implantation sequences and the like. Furthermore, one or more anneal processes may be performed to activate dopant species and re-crystallize implantation-induced damage. The further processing may be continued by forming metal silicide regions in the drain and source regions 207D, 207S and in the gate electrode 204, if required. It should be appreciated, however, that other device strategies may be used, for instance, replacing the gate electrode material 204 and possibly the gate insulation layer 204A with sophisticated materials, such as high-k dielectric materials and metal-containing electrode materials, dependent on the overall process and device requirements. Similarly, if required, an interlayer dielectric material may be provided in the form of a highly-stressed dielectric material in order to further enhance overall transistor performance, if required. For this purpose, well-established process techniques may be applied.

Figure 2C:
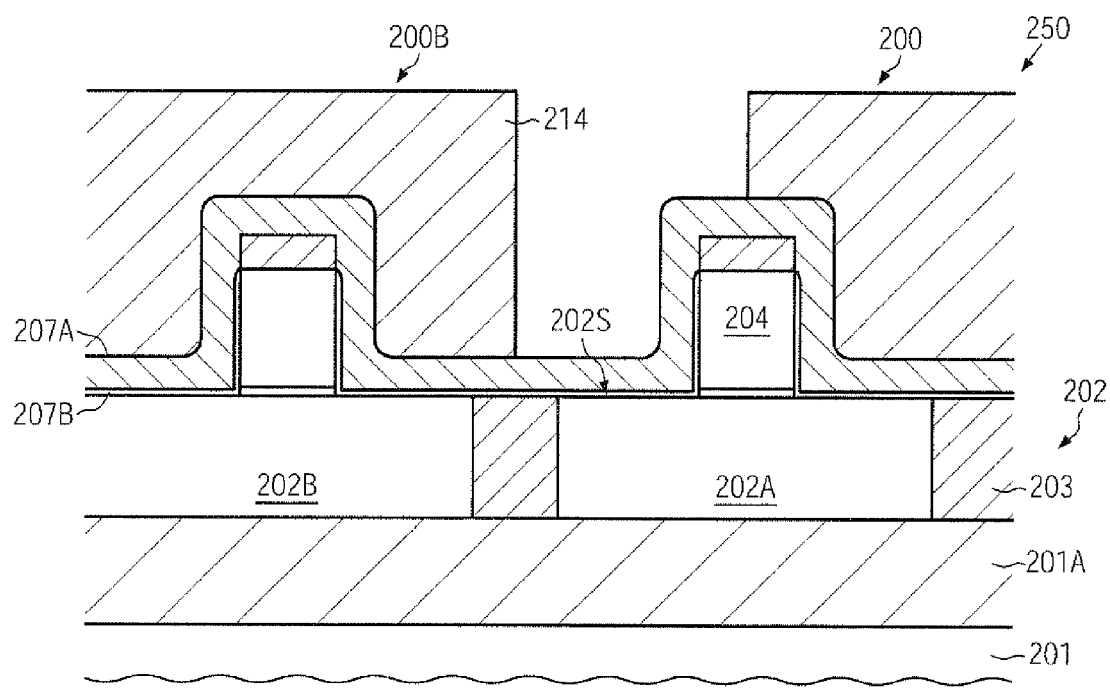
FIGS. 2c-2f schematically illustrate cross-sectional views of the semiconductor device, according to still further illustrative embodiments, in which a strain-inducing semiconductor alloy may be selectively formed on a source side of a transistor on the basis of a masking regime providing a high degree of compatibility with conventional strategies.

FIG. 2c schematically illustrates the semiconductor device 250 according to further illustrative embodiments. As illustrated, the semiconductor device 250 may comprise the transistor 200 and a further transistor 200B, which may be formed in and above a second active region 202B formed in the semiconductor layer 202 on the basis of the isolation structure 203. For example, the transistors 200 and 200B may represent complementary transistors, wherein, in the embodiment shown, the transistor 200B may not require the formation of a strain-inducing semiconductor alloy in the active region 202B. For instance, the transistor 200B may represent an N-channel transistor. Furthermore, in the manufacturing stage shown, a spacer layer 207A, for instance comprised of silicon nitride, may be formed above the active regions 202B, 202A and the corresponding gate electrode structures 204. The spacer layer 207A may be provided in combination with an etch stop liner 207B, if required. For instance, the liner 207B may be comprised of a silicon dioxide material and the like. Furthermore, an etch mask 214, such as a resist mask, may be formed to cover corresponding device portions in which the formation of a strain-inducing semiconductor alloy may not be required. Thus, in the example shown in FIG. 2c, the mask 214 may expose the portion of the spacer layer 207A formed above the source side 202S of the transistor 200.

The semiconductor device 250 as illustrated in FIG. 2c may be formed on the basis of well-established process techniques for providing the spacer layer 207A, possibly in combination with the etch stop liner 207B. Next, the mask 214 may be formed on the basis of lithography techniques, wherein, compared to conventional strategies, an appropriately designed lithography mask may be used to expose only a portion of the transistor 200, that is, the source side 202S. Consequently, the asymmetric configuration of the transistor 200 may be accomplished on the basis of a specifically-designed lithography mask, without requiring any additional lithography processes, since, in conventional strategies, the transistor 200B may also have to be covered during the further processing.

Figure 2D:
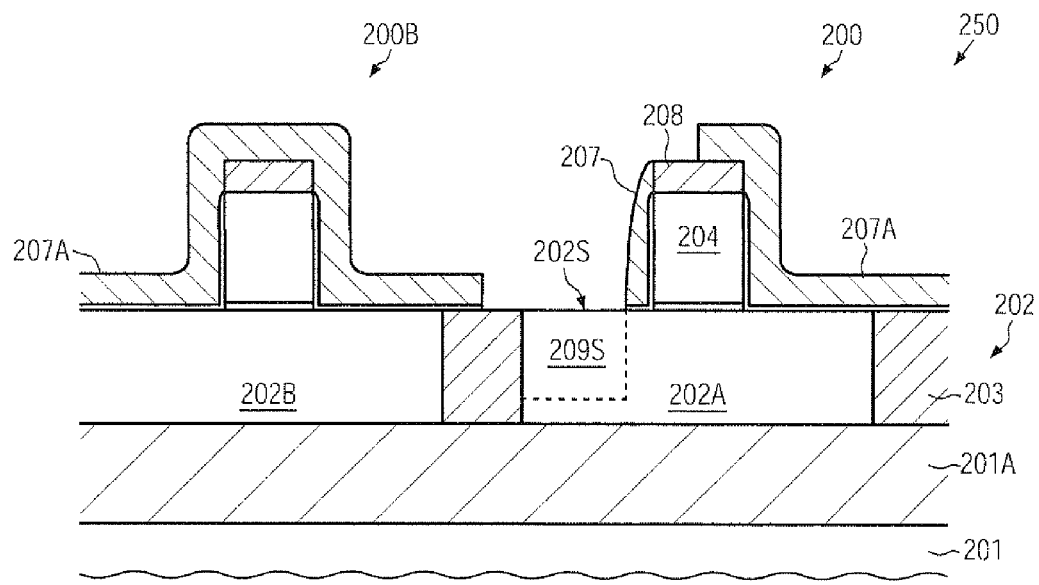

FIG. 2d schematically illustrates the semiconductor device 250 after performing an etch process for removing the exposed portion of the spacer layer 207A and after removal of the resist mask 214 (FIG. 2c). Thus, due to the preceding anisotropic etch process, the spacer element 207 may be formed at the source side 202S, thereby exposing a desired portion of the active region 202A in order to define a lateral size of a cavity to be formed in the etch process. It should be appreciated that, in some illustrative embodiments, the resist mask 214 (FIG. 2c) may be maintained during the subsequent etch process for etching into the active region 202A. In other cases, the resist mask may be removed and the spacer layer 207Am in combination with the cap layer 208 and the spacer 207, may act as an etch mask for forming a cavity 209S. For this purpose, well-established plasma-assisted or wet chemical etch recipes may be applied, depending on the desired size and shape of the source side cavity 209S.

Figure 2E:
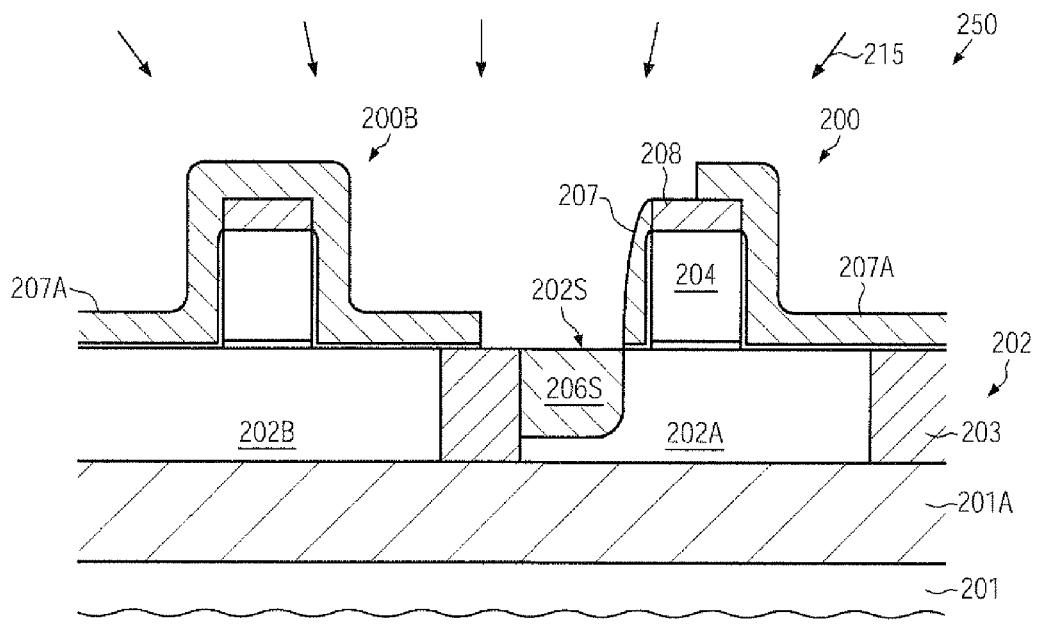

FIG. 2e schematically illustrates the semiconductor device 250 during a selective epitaxial growth process 215, during which the previously formed source side cavity 209S (FIG. 2d) may be filled with the strain-inducing semiconductor alloy 206S. The process 215 may be performed on the basis of any appropriate deposition recipe, in which material composition and thus the degree of strain state of the material 206S and also the degree of in situ doping may be adjusted in accordance with device requirements. For instance, a silicon/germanium alloy with a desired high germanium concentration of approximately 25 atomic percent or higher may be deposited, possibly in combination with an appropriate dopant species in order to obtain the desired characteristics at the source side 202S. Thereafter, the further processing may be continued by removing the spacer layer 207A, the spacer element 207 and the cap layers 208 by using well-established etch recipes, for instance on the basis of hot phosphoric acid, when these components are comprised of silicon nitride.

Figure 2F:
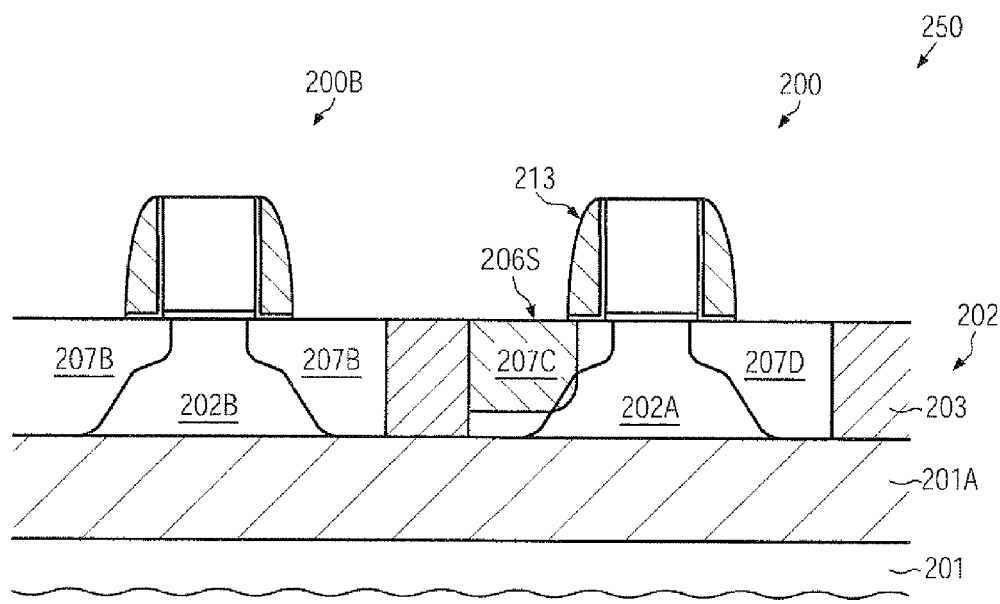

FIG. 2f schematically illustrates the semiconductor device 250 in a further advanced manufacturing stage. As illustrated, the drain and source regions 207D, 207C may be formed in the transistor 200, as previously explained, wherein any appropriate dopant profile may be generated in accordance with the required characteristics of the transistor 200. Furthermore, due to the strain-inducing layer 206S, enhanced flexibility in appropriately adjusting the transistor characteristics may be accomplished, for instance, by appropriately setting the degree of strain-inducing effect, selecting an appropriate in situ dopant concentration of the material 206S, which may, in combination with the additional implantation processes, result in a desired dopant profile at the source side 207C, while corresponding implantation parameters may be specifically designed to comply with the requirements for the drain region 207D, for instance with respect to a reduced electric field strength and the like. On the other hand, the transistor 200B may have formed therein drain and source regions 207B, in accordance with device requirements. With respect to any process strategies for forming the semiconductor device 250, the same criteria may apply as previously explained.

Figure 2G:
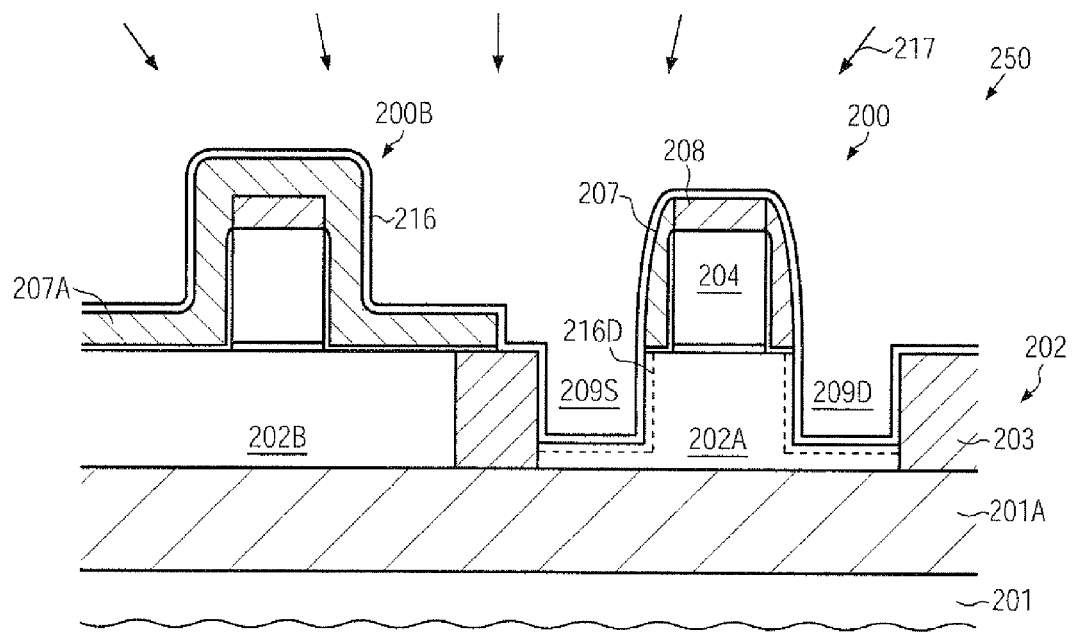
FIGS. 2g-2j schematically illustrate cross-sectional views of the semiconductor device during various manufacturing stages in providing a strain-inducing semiconductor alloy at a source side and forming a semiconductor material at a drain side so as to obtain an asymmetric transistor configuration, according to still further illustrative embodiments.

FIG. 2g schematically illustrates the semiconductor device 250 according to further illustrative embodiments. As illustrated, a drain side cavity 209D and a source side cavity 209S may be formed in the active region 202A of the transistor 200, while the transistor 200B is still covered by the spacer layer 207A. Furthermore, a mask layer 216, such as a silicon dioxide layer, a silicon nitride layer and the like, may be formed above the transistors 200B, 200 and thus also within the cavities 209D, 209S. The semiconductor device 250 as illustrated in FIG. 2g may be formed on the basis of the following process techniques. After forming the gate electrode structures 204 of the transistors 200, 200B, the spacer layer 207A may be formed, as for instance previously explained. Thereafter, a corresponding etch mask may be provided so as to expose the transistor 200, while covering the transistor 200B. During a subsequent anisotropic etch process, the spacer elements 207 may be formed from the spacer layer 207A and may be used as an etch mask for etching into the active region 202A, thereby obtaining the cavities 209D, 209S. Thereafter, the mask layer 216 may be formed, for instance, by deposition or, in other cases, by oxidation, as indicated by the dashed line 216D, in which case the mask layer 216 may be selectively formed within the cavities 209D, 209S. It should be appreciated that a corresponding material consumption may be taken into consideration when defining the lateral size and the depth of the cavities 209D, 209S. In other cases, the process 217 may be performed as a deposition process on the basis of well-established recipes, such as plasma-assisted chemical vapor deposition (CVD), thermally-activated CVD and the like.

Figure 2H:
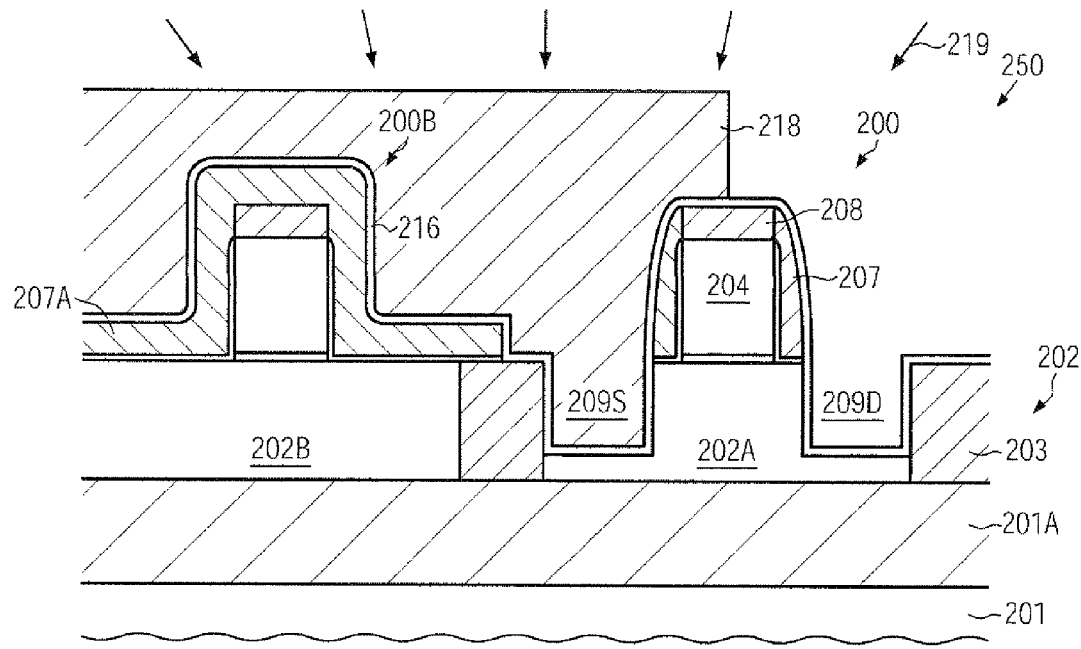

FIG. 2h schematically illustrates the semiconductor device 250 with an etch mask 218, such as a resist mask, which may cover the transistor 200B and which may cover the drain side or the source side of the transistor 200. In the example shown in FIG. 2h, the mask 218 may expose the drain side cavity 209D. Furthermore, the device 250 may be exposed to an etch ambient 219 established on the basis of an appropriate etch chemistry for removing the exposed portion of the mask layer 216 selectively to material of the active region 202A. For this purpose, any appropriate selective etch recipe, such as wet chemical etch recipes, may be used. For instance, silicon dioxide may be removed selectively with respect to silicon material on the basis of hydrofluoric acid. Similarly, a silicon nitride material may be removed on the basis of hot phosphoric acid. In this case, a reliable confinement of the gate electrode 204 may still be ensured, since the thickness of the mask layer 216 may be significantly less compared to the thickness of the spacer 207 and the cap layer 208.

Figure 2I:
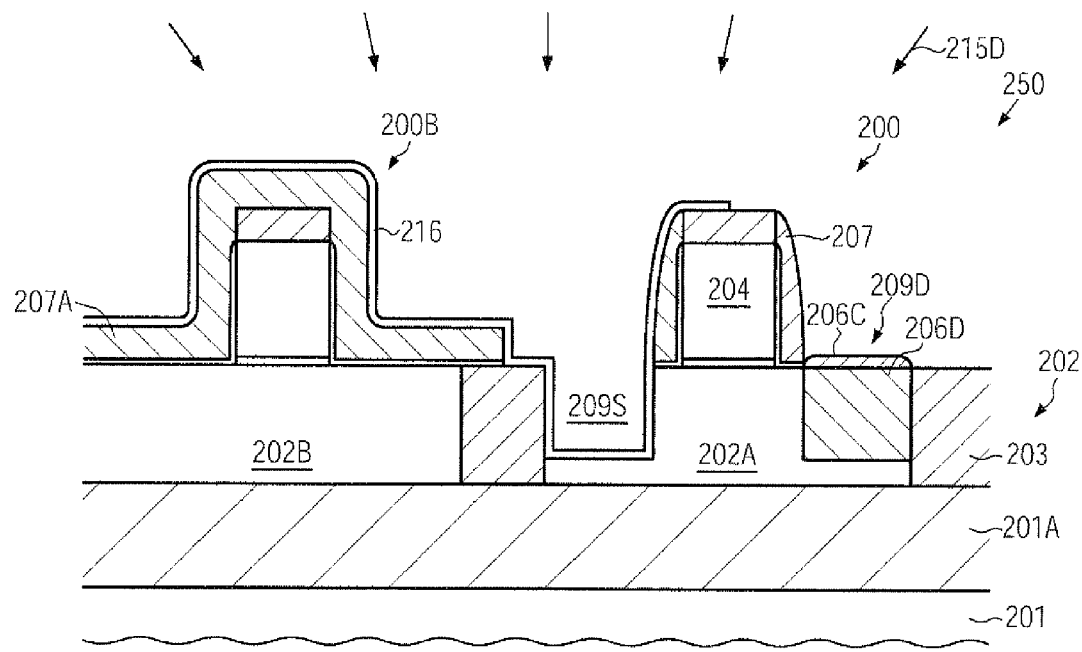

FIG. 2i schematically illustrates the semiconductor device 250 in a further advanced manufacturing stage. As illustrated, the device 250 may be exposed to a selective deposition ambient 215D that may be established so as to selectively deposit a semiconductor material 206D in the drain side cavity 209D. For example, the semiconductor material 206D may be comprised of a strain-inducing semiconductor alloy, as was previously explained, wherein, however, the material composition may be appropriately selected so as to comply with the requirements at the drain side of the transistor 200. For instance, if a compressive strain component is to be induced, the corresponding strain-inducing species, such as germanium, tin and the like, may be provided with a reduced concentration compared to a corresponding strain-inducing alloy to be formed in the source side cavity 209S in a later manufacturing stage. Furthermore, the material 206D may be provided with an appropriate in situ dopant concentration or may be provided as a substantially intrinsic semiconductor material, depending on the further processing for forming the drain and source regions. Since the material 206D may be formed separately from a corresponding strain-inducing semiconductor alloy in the source side cavity 209S, an enhanced degree of flexibility in adjusting the overall asymmetric configuration of the transistor 200 may be accomplished by appropriately selecting the deposition parameters of the process 215D. In some illustrative embodiments, the material 206D may be provided with a certain degree of excess height in order to enable the selective formation of a further deposition mask 206C without reducing the height of the material 206D. That is, after completing the deposition process 215D, an appropriate surface treatment, such as an oxidation, a nitration and the like, may be performed to convert a portion of the material 206D into a dielectric material to provide the deposition mask 206C. In some illustrative embodiments, the deposition mask 206C may have a different etch behavior compared to the mask layer 216, which may still be formed in the source side cavity 209S. It should be appreciate that a different etch behavior may also be accomplished by providing an increased thickness for the deposition mask 206C compared to the layer 216. For instance, during an oxidation process, the material 206D or any excess material thereof may have a significantly increased oxidation rate, compared to the mask layer 216 so that a corresponding increased thickness may be obtained, which may allow a removal of the mask layer 216 while nevertheless maintaining at least a portion of the deposition mask 209C. In other cases, the materials of the layer 216 and the deposition mask 209C may be different due to a different "response" of the layer 216 and the material 206D to a corresponding surface treatment, thereby also obtaining a different etch behavior, which may thus also allow selectively removing the layer 216 while maintaining at least a portion of the deposition mask 206C. Consequently, after removing the layer 216, the exposed source side cavity 209S may be prepared for a further selective epitaxial growth process on the basis of any appropriate wet chemical cleaning recipe.

Figure 2J:
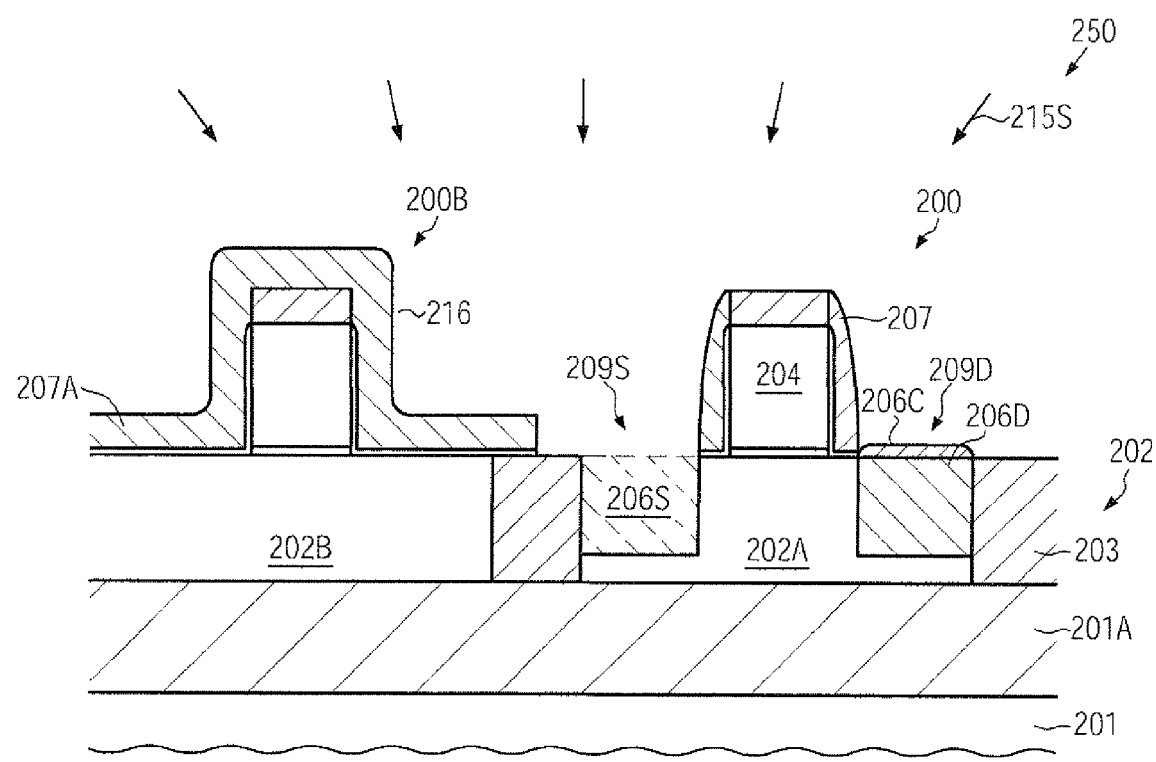

FIG. 2j schematically illustrates the semiconductor device 250 when exposed to a corresponding deposition ambient 215S in order to form the strain-inducing semiconductor alloy 206S in the source side cavity 209S. As previously explained, the selective epitaxial growth process 215S may be performed on the basis of any desired process parameter setting in order to obtain the material 206S with characteristics that comply with the requirements for the source side of the transistor 200. For example, a moderately high strain-inducing effect may be accomplished by the material 206S by appropriately selecting the material composition thereof, for instance, by selecting a moderately high germanium and/or tin concentration, if a pronounced compressive strain component may be desired for the transistor 200. Furthermore, a desired high dopant concentration may be incorporated into the material 206S, as previously explained. During the process 215S, significant material deposition at the drain side 209D of the transistor 200 may be suppressed by the deposition mask 206C so that the characteristics of the previously-deposited material 206D may be substantially maintained without being affected by the process 215S. Consequently, a high degree of flexibility in designing the asymmetric configuration of the transistor 200 may be accomplished by the processes 215D, 215S for forming the materials 206D, 206S, which may at least differ in their material composition and the in situ dopant concentration provided therein.

It should be appreciated that, in the above-described process sequence, the order of providing the materials 206D, 206S may be reversed by first exposing the source side cavity 209S and forming the material 206S, which may also be provided with an appropriate deposition mask on the basis of process strategies as previously explained with reference to the deposition mask 206C. Thereafter, the drain side cavity 209D may be exposed and the material 206D may be deposited with desired material characteristics.

As a result, the present disclosure provides semiconductor devices and manufacturing techniques in which an asymmetric transistor configuration may be achieved on the basis of a strain-inducing semiconductor alloy, which may be formed in an asymmetric manner with respect to a drain side and a source side of a transistor. For this purpose, less critical implantation processes may be used in combination with an appropriate masking regime to provide a certain degree of strain relaxation, while, in other illustrative embodiments, the strain-inducing semiconductor material may itself be provided in an asymmetric manner, for instance, by forming corresponding cavities exclusively at the source side, while masking the drain side during a corresponding etch and deposition sequence. In still other illustrative embodiments, the asymmetric configuration may be accomplished by performing two different epitaxial growth processes for the drain side and the source side, respectively. Consequently, enhanced transistor performance may be achieved while reducing the variability that may typically be associated with sophisticated implantation techniques, which are conventionally used for providing an asymmetric transistor configuration. Due to the asymmetric configuration, enhanced hot carrier behavior and drain-induced barrier lowering effect may be observed, while, additionally, the overall drive current capability may be enhanced by appropriately designing the asymmetric configuration of the strain-inducing semiconductor alloy.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a gate electrode structure above a crystalline semiconductor region;
after forming said gate electrode structure, forming a semiconductor alloy in cavities formed in said crystalline semiconductor region, said cavities being laterally offset from a channel region of a transistor, said semiconductor alloy inducing strain in said channel region; and
selectively introducing a non-doping species into said semiconductor alloy positioned at a drain side of said transistor to reduce an internal strain level of said semiconductor alloy positioned at said drain side.

2. The method of claim 1, wherein selectively introducing said non-doping species comprises forming an implantation mask to cover a source side and expose said drain side and performing an implantation process on the basis of said implantation mask.

3. The method of claim 1, wherein said non-doping species comprises at least one of silicon, xenon, argon and fluorine.

4. The method of claim 3, wherein the ion implantation process is performed on the basis of a dopant species.

5. The method of claim 1, further comprising forming a drain region at least partially in said semiconductor alloy of reduced internal strain level and forming a source region at least partially in said semiconductor alloy positioned at said source side.

6. The method of claim 1, wherein said semiconductor alloy comprises at least one of germanium and tin.

7. A method of forming an asymmetric transistor, the method comprising:
forming a gate electrode structure above a semiconductor region;

after forming said gate electrode structure, forming a source side cavity in said semiconductor region, said source side cavity being positioned laterally offset from a channel region located below said gate electrode structure of said transistor; and forming a strain-inducing semiconductor alloy in said source side cavity, said strain-inducing semiconductor alloy representing an asymmetric transistor configuration of a source side relative to a drain side of said transistor, wherein the asymmetric transistor configuration comprises at least one of a dopant profile and a dopant concentration.

8. The method of claim 7, wherein forming said source side cavity comprises forming an etch mask that covers said drain side and exposes said source side and performing an etch process on the basis of said etch mask.

9. The method of claim 8, wherein forming said etch mask comprises depositing a spacer layer above said gate electrode structure, forming a resist mask above said drain side and patterning said spacer layer on the basis of said resist mask.

10. The method of claim 9, wherein said spacer layer and said resist mask are formed so as to cover a second transistor.

11. The method of claim 9, wherein forming said semiconductor alloy comprises performing a selective epitaxial growth process and using said patterned spacer layer as a deposition mask.

12. The method of claim 7, further comprising forming a drain side cavity and forming a semiconductor material in said drain side cavity.

13. The method of claim 12, wherein said source side cavity and said drain side cavity are formed in a common etch process.

14. The method of claim 12, wherein forming said strain-inducing semiconductor alloy and said semiconductor material comprises forming a first deposition mask in one of said drain side cavity and said source cavity and performing a first selective epitaxial growth process to grow one of said strain-inducing semiconductor alloy and said semiconductor material.

15. The method of claim 14, further comprising forming a second deposition mask on said one of said strain-inducing semiconductor alloy and said semiconductor material, removing said first deposition mask and growing the other one of said strain-inducing semiconductor alloy and said semiconductor material.

16. The method of claim 12, wherein said semiconductor material differs from said strain-inducing semiconductor alloy in at least one of a material composition and an internal dopant concentration.

17. The method of claim 16, wherein said semiconductor material induces strain in said channel region.

18. An asymmetric transistor, comprising:
a gate electrode structure formed above a channel region;
a source region formed at a source side of a semiconductor region of said transistor;
a strain-inducing semiconductor alloy formed at said source side; and
a drain region formed at a drain side of said semiconductor region, said drain side differing from said source side in an amount of strain induced in said channel region and in at least one of a dopant profile and a dopant concentration.

19. The asymmetric transistor of claim 18, further comprising at least one of:
wherein said drain side comprises a semiconductor alloy and a non-doping species; and
wherein said drain side differs from said source side in material composition.

20. The asymmetric transistor of claim 19, wherein said semiconductor alloy is in a substantially relaxed state.

21. The asymmetric transistor of claim 18, wherein said strain-inducing semiconductor alloy is exclusively positioned at said source side.

22. The asymmetric transistor of claim 18, further comprising a second semiconductor alloy formed at said drain side, wherein said strain-inducing semiconductor alloy differs from said second semiconductor alloy in at least a dopant concentration and a material composition.

23. The asymmetric transistor of claim 22, wherein said second semiconductor alloy is provided in a lesser strained state compared to said strain-inducing semiconductor alloy.

24. The asymmetric transistor of claim 18, wherein said strain-inducing semiconductor alloy comprises at least one of germanium and tin.

25. The asymmetric transistor of claim 18, wherein said strain-inducing semiconductor alloy comprises carbon.

\* \* \* \* \*